(12) United States Patent
Wang et al.

(10) Patent No.: US 10,741,634 B2
(45) Date of Patent: Aug. 11, 2020

(54) WIRING STRUCTURE, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Benlian Wang, Beijing (CN); Li Wang, Beijing (CN); Yipeng Chen, Beijing (CN); Yueping Zuo, Beijing (CN); Zheng Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/468,341

(22) PCT Filed: Nov. 6, 2017

(86) PCT No.: PCT/CN2017/109517
§ 371 (c)(1),
(2) Date: Jun. 11, 2019

(87) PCT Pub. No.: WO2018/196322
PCT Pub. Date: Nov. 1, 2018

(65) Prior Publication Data
US 2019/0333980 A1    Oct. 31, 2019

(30) Foreign Application Priority Data
Apr. 28, 2017    (CN) .......................... 2017 1 0296363

(51) Int. Cl.
*G02F 1/13* (2006.01)
*H01L 27/32* (2006.01)
(Continued)

(52) U.S. Cl.
CPC ........ *H01L 27/3276* (2013.01); *G02F 1/1345* (2013.01); *G02F 1/133305* (2013.01);
(Continued)

(58) Field of Classification Search
CPC ............. H01L 27/3276; H01L 27/3288; H01L 51/0097; H01L 27/1218; H01L 27/1244;
(Continued)

(56) References Cited

U.S. PATENT DOCUMENTS

2014/0138637 A1    5/2014    Yang et al.
2016/0174304 A1*   6/2016    Kim ....................... H05B 33/04
                                                              313/511
(Continued)

FOREIGN PATENT DOCUMENTS

CN    202018547 U    10/2011
CN    104769719 A    7/2015
(Continued)

OTHER PUBLICATIONS

WO2018040698 English Translation (Year: 2018).*
(Continued)

*Primary Examiner* — Steven T Sawyer
(74) *Attorney, Agent, or Firm* — Calfee, Halter & Griswold LLP

(57) ABSTRACT

A wiring structure, a display substrate and a display device; the wiring structure comprises a plurality of hollow patterns, and edges of the wiring structure along a length direction of the wiring structure extend in a straight line, the wiring structure can release stress through the hollow patterns so as (Continued)

to avoid breakage of the wiring structure, the display substrate, and the display device.

10 Claims, 4 Drawing Sheets

(51) Int. Cl.
    *G02F 1/1333*     (2006.01)
    *G02F 1/1345*     (2006.01)
    *G02F 1/1362*     (2006.01)
    *H01L 51/00*     (2006.01)
    *H01L 27/12*     (2006.01)

(52) U.S. Cl.
    CPC .... *G02F 1/136286* (2013.01); *H01L 27/3288* (2013.01); *H01L 51/0097* (2013.01); *H01L 27/1218* (2013.01); *H01L 27/1244* (2013.01); *H01L 2251/5338* (2013.01)

(58) Field of Classification Search
    CPC ....... H01L 2251/5338; G02F 1/133305; G02F 1/1345; G02F 1/136286; G02F 1/133
    USPC .......................................................... 174/254
    See application file for complete search history.

(56) References Cited

U.S. PATENT DOCUMENTS

| | | | |
|---|---|---|---|
| 2016/0216464 A1* | 7/2016 | Tsujita | ................. H05K 1/0274 |
| 2017/0060281 A1 | 3/2017 | Xie et al. | |
| 2017/0256599 A1* | 9/2017 | Kim | ..................... G09G 3/3291 |
| 2017/0352717 A1* | 12/2017 | Choi | ................... H01L 51/0097 |
| 2019/0333980 A1 | 10/2019 | Wang et al. | |

FOREIGN PATENT DOCUMENTS

| | | |
|---|---|---|
| CN | 105183219 A | 12/2015 |
| CN | 205140985 U | 4/2016 |
| CN | 106205394 A | 12/2016 |
| CN | 106952937 A | 7/2017 |
| JP | 2002171031 A | 6/2002 |

OTHER PUBLICATIONS

CN 106205394 (Year: 2016).*
Search Report and Written Opinion for International Application No. PCT/CN2017/109517 dated Feb. 9, 2018.
First Office Action for Chinese Patent Application No. 201710296363.8 dated Mar. 19, 2019.

* cited by examiner

WIRING STRUCTURE, DISPLAY SUBSTRATE AND DISPLAY DEVICE

RELATED APPLICATIONS

This application is the U.S. national phase entry of PCT Application No. PCT/CN2017/109517, filed Nov. 6, 2017, which is based upon and claims priority to Chinese Patent Application No. 201710296363.8, filed on Apr. 28, 2017, the entire disclosure of which is incorporated herein by reference.

TECHNICAL FIELD

The present disclosure belongs to the field of display technologies, and specifically to a wiring structure, a display substrate and a display device.

BACKGROUND

In order to fabricate a flexible display device, many display members made of organic materials have been developed, for example, an organic light emitting layer, an organic passivation layer, and a polymer substrate (e.g., a PI substrate) serving as a flexible substrate. However, it is infeasible to replace metallic wiring in a display with organic materials because the electrical conductivity of organic materials is much lower than that of the metallic wire. When a flexible display device is being bent, the metallic wiring in the display panel may break (the ratio is about 1%), resulting in failure of the display device.

SUMMARY

The present disclosure is intended to at least alleviate or mitigate one of the technical problems existing in the prior art, and provide a wiring structure, a display substrate and a display device that are not easily broken.

A wiring structure provided by an exemplary embodiment comprises a plurality of hollow patterns, and edges of the wiring structure along a length direction of the wiring structure extend in a straight line.

Further, in some exemplary embodiments, the wiring structure further comprises at least one bridge portion within a region where the hollow patterns are located, and the bridge portion is connected across different sides or endpoints of the hollow patterns.

In some exemplary embodiments, the plurality of hollow patterns are sequentially arranged along the length direction of the wiring structure.

In some exemplary embodiments, any adjacent hollow patterns of the plurality of hollow patterns are arranged in a staggered manner along the length direction of the wiring structure.

Alternatively, in some exemplary embodiments, any adjacent hollow patterns of the plurality of hollow patterns are arranged in a staggered manner along the length direction of the wiring structure and a direction perpendicular to the length direction of the wiring structure.

Further, in certain exemplary embodiments, any adjacent hollow patterns of the plurality of hollow patterns are symmetrical to each other.

In some exemplary embodiments, the plurality of hollow patterns comprise at least one selected from a group consisting of a triangle, a quadrangle, a hexagon, a circle and an ellipse.

In some exemplary embodiments, the material for the wiring structure comprises a metal.

A further exemplary embodiment provides a display substrate comprising a substrate and the wiring structure according to any of the above exemplary embodiments.

In some exemplary embodiments, the substrate comprises a flexible substrate.

Yet another exemplary embodiment provides a display device comprising the display substrate according to the above exemplary embodiments.

Since the wiring structure in the exemplary embodiments is provided with a plurality of hollow patterns, during the process of being bent, stretched and twisted, the wiring structure can release stress through the hollow patterns so as to avoid breakage of the wiring structure which would result in failure of devices on the substrate to which the wiring structure is applied. Particularly, for a flexible substrate, since the flexible substrate itself is prone to bending, use of the wiring structure in such embodiments can greatly improve the yield of the flexible substrate.

DETAILED DESCRIPTION

To enable those skilled in the art to better understand the technical solution provided by the exemplary embodiments of the disclosure, it will be further described in detail below in conjunction with the accompanying drawings and examples.

As shown in FIGS. 1-8, exemplary embodiments provide a wiring structure comprising a plurality of hollow patterns 10, and edges 11 of the wiring structure along a length direction of the wiring structure extend in a straight line.

Since the wiring structure in this exemplary embodiment is provided with a plurality of hollow patterns 10, during the process of being bent, stretched and twisted, the wiring structure can release stress through the hollow patterns 10 thereon to avoid breakage of the wiring structure that would result in failure of devices on the substrate to which the wiring structure is applied. Particularly, for a flexible substrate, since the flexible substrate itself is prone to bending, the wiring structure in this exemplary embodiment can greatly improve the yield of the flexible substrate.

In some exemplary embodiments, as shown in FIGS. 1-5, the hollow patterns 10 in the wiring structure are arranged along the length direction of the wiring structure. That is, the centers of gravity of the hollow patterns 10 are on the same straight line. It is to be noted that the hollow patterns 10 are disposed at intervals, and the spacing between adjacent hollow patterns 10 may depend on specific circumstances.

In the exemplary embodiments, the shapes of the hollow patterns 10 successively disposed along the length direction of the wiring structure may be the same or different. It can be understood that the hollow patterns 10 having the same shape may facilitate the preparation of the wiring structure.

Figure 7:
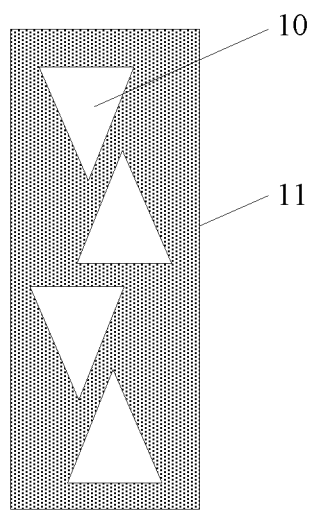
FIG. 7 is a schematic view illustrating that any two adjacent hollow patterns in a wiring structure according to a further exemplary embodiment are arranged in a staggered manner.

In another exemplary embodiment, as shown in FIG. 7, among the hollow patterns 10 in the wiring structure, any two adjacent hollow patterns 10 are arranged in a staggered manner along the length direction of the wiring structure. The staggered arrangement means that, if one of two adjacent hollow patterns 10 is moved towards the other one of the two adjacent hollow patterns 10 along the length direction of the wiring structure, and they partially overlap each other, it is then considered that the two hollow patterns 10 are arranged in a staggered manner before movement. In some exemplary embodiments, the staggered arrangement also means that the orthographic projections of any adjacent hollow patterns on the edges of the wiring structure that are perpendicular to the length direction partially overlap each other. In this case, the arrangement of the hollow patterns 10 may involve two situations. In an example, the hollow patterns 10 exhibit a stepped arrangement in the length direction of the wiring structure. In another example, only two adjacent hollow patterns are arranged in a staggered manner, e.g., while all the centers of gravity of odd-numbered hollow patterns 10 are in a straight line, and all the centers of gravity of even-numbered hollow patterns 10 are in a straight line, as shown in FIG. 7.

Figure 8:
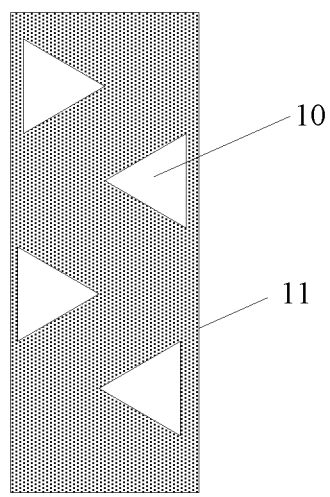
FIG. 8 is a schematic view illustrating that any two adjacent hollow patterns in a wiring structure according to yet another exemplary embodiment are arranged in a staggered manner.

In another exemplary embodiment, as shown in FIG. 8, among the hollow patterns 10 in the wiring structure, any two adjacent hollow patterns 10 are arranged in a staggered manner along the length direction of the wiring structure and a direction perpendicular to the length direction of the wiring structure. In this exemplary embodiment, the staggered arrangement indicates that, if one of any two adjacent hollow patterns 10 is moved towards the other one along the length direction of the wiring structure, or one of them is moved towards the other one along a direction perpendicular to the length direction, they do not overlap each other in both of the above situations, it is then considered that the two hollow patterns 10 are arranged in a staggered manner before movement. In this case, such a staggered arrangement also means that the orthographic projections of any adjacent hollow patterns on the sides of the wiring structure that are perpendicular to the length direction do not overlap each other, and that the orthographic projections thereof on the sides parallel to the length direction do not overlap each other. In this case, the arrangement of the hollow patterns 10 may also include two situations. In an example, the hollow patterns 10 exhibit a stepped arrangement along the length direction of the wiring structure. In another example, only two adjacent hollow patterns 10 are arranged in a staggered manner, while the centers of gravity of odd-numbered hollow patterns 10 are in a straight line, and the centers of gravity of even-numbered hollow patterns 10 are in a straight line, as shown in FIG. 8.

In the example shown in FIG. 8, any two adjacent ones of the hollow patterns 10 are symmetrical to each other. In this way, the hollow patterns 10 can be evenly arranged in the wiring structure, which is advantageous for the uniformity of the wiring structure. In an example, as shown in FIG. 8, the hollow patterns 10 include triangles, and two adjacent triangular hollow patterns 10 are opposite to each other. It is to be noted that, FIG. 8 merely schematically shows two columns of hollow patterns 10, and more columns of hollow patterns 10 may be disposed along the length direction of the wiring structure.

In some exemplary embodiments, as shown in FIGS. 1-5, the above-described hollow patterns 10 include any one or more selected from the group consisting of a triangle, a quadrangle, a hexagon, a circle, and an ellipse. That is, the shapes of the hollow patterns 10 in the wiring structure may be completely the same, completely different, or partially the same. In an example, all the hollow patterns 10 in the wiring structure have the same shape, which facilitates the preparation of the wiring structure.

In a further exemplary embodiment, the wiring structure may further comprise at least one bridge portion 12 that is located within a region where the hollow pattern 10 is located and connects different sides or endpoints of the hollow pattern 10.

Figure 1:
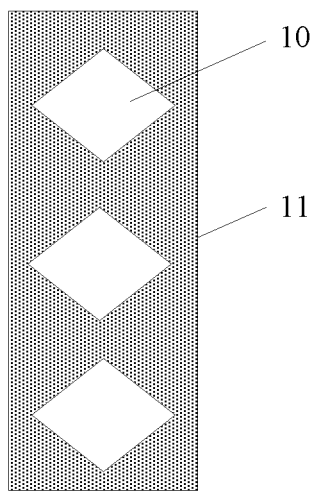
FIG. 1 is a schematic view illustrating that hollow patterns in a wiring structure according to an exemplary embodiment are quadrangles.
Figure 2:
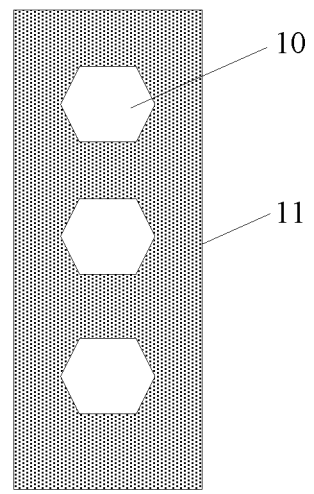
FIG. 2 is a schematic view illustrating that hollow patterns in a wiring structure according to another exemplary embodiment are hexagons.
Figure 3:
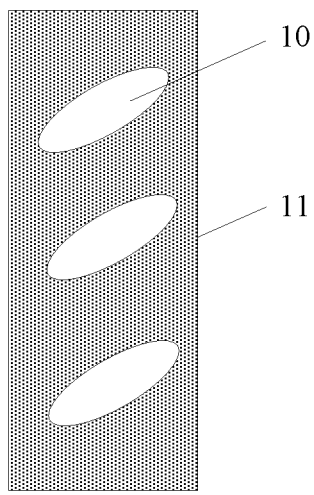
FIG. 3 is a schematic view illustrating that hollow patterns in a wiring structure according to another exemplary embodiment are ellipses.
Figure 4:
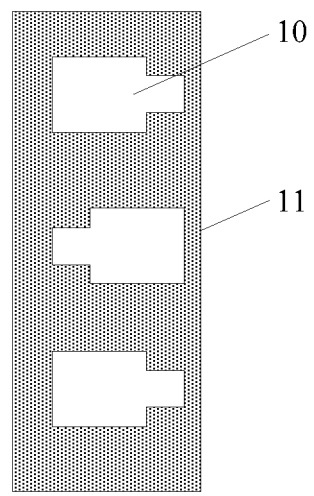
FIG. 4 is a schematic view illustrating that hollow patterns in a wiring structure according to another exemplary embodiment are irregular polygons.
Figure 5:
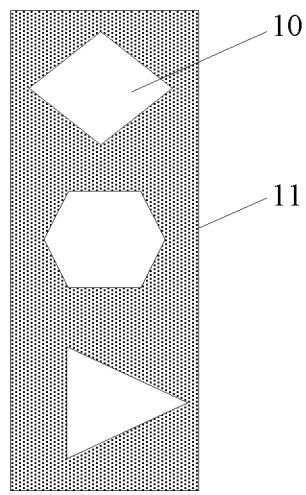
FIG. 5 is a schematic view illustrating that a wiring structure according to another exemplary embodiment has different hollow patterns.
Figure 6:
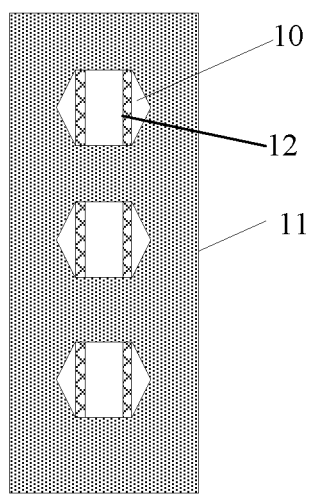
FIG. 6 is a schematic view illustrating that a wiring structure according to a further exemplary embodiment has a connection portion.

Taking the wiring structure shown in FIG. 6 as an example, the hollow patterns 10 include a hexagonal pattern. Two bridge portions 12 are disposed in the hexagonal hollow pattern 10, each of which connects two parallel sides of the hexagonal hollow pattern 10. Of course, the number of bridge portions 12 may be one or more, and different bridge portions 12 in the region of the hexagonal hollow pattern 10 may intersect with each other or be in parallel to each other. The wiring structure in the exemplary embodiments may include a metal material, so that the wiring structure may have good conductivity.

Another exemplary embodiment provides a display substrate comprising a substrate and a wiring structure on the substrate. The wiring structure may be a wiring structure as described in any of the foregoing exemplary embodiments.

The display substrate in this exemplary embodiment may be a flexible display substrate, that is, the substrate is made of a flexible material such as polyimide (PI) or the like.

Since the wiring structure in the display substrate of this exemplary embodiment is provided with a plurality of hollow patterns, during the process of being bent, stretched and twisted, stress can be released through the hollow patterns 10 so as to avoid breakage of the wiring structure which would in turn result in failure of devices on the substrate to which the wiring structure is applied. Particularly, for a flexible substrate, since the flexible substrate itself is prone to bending, usage of the wiring structure in this embodiment can greatly improve the yield of the flexible substrate.

A further exemplary embodiment provides a display device comprising the display substrate described in the foregoing exemplary embodiments. The display device may be a liquid crystal display device or an electroluminescent display device, for example, any product or component having display function such as a liquid crystal panel, an electronic paper, an OLED panel, a mobile phone, a tablet computer, a television, a display, a notebook computer, a digital photo frame, a navigator, and the like.

It is to be understood that the above-described embodiments are merely some exemplary embodiments for illustrating the principles of the disclosure, but the disclosure is not so limited. Various modifications and improvements can be made by those ordinarily skilled in the art without departing from the spirit and scope of the disclosure. These modifications and improvements are also considered to be within the scope of the application.

The invention claimed is:

1. A wiring structure comprising a plurality of hollow patterns, wherein edges of the wiring structure along a length direction of the wiring structure extend in a straight line,
   wherein the plurality of hollow patterns are spaced apart from each other by a material of the wiring structure and aligned with each other along the length direction of the wiring structure, and each hollow pattern of the plurality of hollow patterns is in a form of a through hole in the wiring structure,
   wherein the wiring structure further comprises a plurality of bridge portions distributed within the plurality of hollow patterns, each hollow pattern surrounds at least two bridge portions of the plurality of bridge portions, each bridge portion extends along the length direction of the wiring structure, wherein the bridge portion is connected across different sides or endpoints of the hollow pattern,
   wherein the at least two bridge portions are parallel to each other, a width of each of the at least two bridge portions along a width direction of the wiring structure is smaller than a minimum distance between two edges of two adjacent hollow patterns of the plurality of hollow patterns closest to each other in the length direction of the wiring structure, the width direction of the wiring structure is perpendicular to the length direction of the wiring structure.

2. The wiring structure according to claim 1, wherein the plurality of hollow patterns are sequentially arranged along the length direction of the wiring structure.

3. The wiring structure of claim 1, wherein any adjacent hollow patterns of the plurality of hollow patterns are arranged in a staggered manner along the length direction of the wiring structure.

4. The wiring structure according to claim 1, wherein any adjacent hollow patterns of the plurality of hollow patterns are arranged in a staggered manner along the length direction of the wiring structure and a direction perpendicular to the length direction of the wiring structure.

5. The wiring structure according to claim 4, wherein any adjacent hollow patterns of the plurality of hollow patterns are symmetrical to each other.

6. The wiring structure according to claim 1, wherein the plurality of hollow patterns comprise at least one selected from a group consisting of a triangle, a quadrangle, a hexagon, a circle and an ellipse.

7. A display substrate comprising a substrate and the wiring structure according to claim 1 on the substrate.

8. The display substrate according to claim 7, wherein the substrate comprises a flexible substrate.

9. A display device comprising the display substrate according to claim 7.

10. A display device comprising the display substrate according to claim 8.

* * * * *